(12) United States Patent
Lee

(10) Patent No.: US 11,394,146 B2
(45) Date of Patent: Jul. 19, 2022

(54) TREATED CONNECTION PINS FOR HIGH SPEED EXPANSION SOCKETS

(71) Applicant: QUANTA COMPUTER INC., Taoyuan (TW)

(72) Inventor: Cheng-Hsien Lee, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 233 days.

(21) Appl. No.: 16/842,430

(22) Filed: Apr. 7, 2020

(65) Prior Publication Data

US 2021/0313724 A1 Oct. 7, 2021

(51) Int. Cl.
*H01R 13/05* (2006.01)
*H01R 13/03* (2006.01)
*H01R 12/71* (2011.01)
*H01R 12/73* (2011.01)

(52) U.S. Cl.
CPC ........... *H01R 13/05* (2013.01); *H01R 12/714* (2013.01); *H01R 12/737* (2013.01); *H01R 13/03* (2013.01); *H01R 13/035* (2013.01); *H01R 2201/06* (2013.01)

(58) Field of Classification Search
CPC .... H01R 13/05; H01R 12/714; H01R 12/737; H01R 13/03; H01R 13/035; H01R 2201/06; H01R 12/58; H01R 13/6461; H01R 43/16; H01R 12/716; H01R 12/51; H01R 13/10; H01R 43/20; H05K 1/11
See application file for complete search history.

(56) References Cited

U.S. PATENT DOCUMENTS

| 4,747,783 | A | * | 5/1988 | Bellamy | H01R 13/03 200/268 |
|---|---|---|---|---|---|
| 5,190,486 | A | * | 3/1993 | Tsuk | C25D 5/022 205/133 |
| 6,802,729 | B2 | * | 10/2004 | Hermann, Jr | H01R 13/03 439/181 |
| 10,998,657 | B2 | * | 5/2021 | Esmaeili | H01R 13/03 |
| 2005/0103761 | A1 | * | 5/2005 | Miki | H01R 13/03 219/121.69 |
| 2015/0282319 | A1 | * | 10/2015 | Salzman | H05K 1/141 361/788 |
| 2016/0242273 | A1 | * | 8/2016 | Huang | H05K 1/0234 |
| 2019/0036251 | A1 | * | 1/2019 | Kolivoski | H01R 24/60 |
| 2019/0273341 | A1 | * | 9/2019 | Chandra | H01R 12/71 |
| 2020/0176904 | A1 | * | 6/2020 | Zhong | H01R 13/6272 |
| 2020/0328542 | A1 | * | 10/2020 | Qin | H01R 12/57 |

* cited by examiner

*Primary Examiner* — Travis S Chambers
(74) *Attorney, Agent, or Firm* — Nixon Peabody LLP

(57) ABSTRACT

A connection pin for an expansion socket can be treated to improve signal (e.g., reduce noise) for high speed applications. A connection pin can be treated to have a conductive plating covering a proximal region of the connection pin. Electrical signals between an expansion card in contact with the connection pin and the circuit board to which the connection pin is coupled can pass directly through the conductive plating of the proximal region. However, the distal region of the connection pin can be treated to be devoid of the conductive plating, such as by being covered with a high dielectric loss and/or high-resistance material or through removal of the conductive plating in that region. Thus, electrical signals passing through the connection pin will tend to pass through the conductive plating rather than along the distal region of the pin. Thus, signal reflections and other artifacts and noise can be avoided.

19 Claims, 6 Drawing Sheets

TREATED CONNECTION PINS FOR HIGH SPEED EXPANSION SOCKETS

TECHNICAL FIELD

The present disclosure relates to computers generally and more specifically to expansion card connectors.

BACKGROUND

Many computing devices make use of expansion cards or add-on cards. For example, the Peripheral Component Interconnect Express (PCIe) interface can involve a PCIe socket coupled to a motherboard that is designed to receive a PCIe expansion card. When the expansion card is inserted into the socket, numerous connector pins within the socket make contact with connection pads on the expansion card, thereby establishing an electrical connection between components on the motherboard and components on the expansion card. Such expansion cards can facilitate adding additional functionality (e.g., networking, storage, processing, and other such functionality) to a computer system by simply installing one or more expansion cards.

As the demand for increased computing power grows, these expansion card interfaces continue to rely on higher communication speeds to increase throughput. Current expansion card interface designs are susceptible to substantial signal losses, especially when high communication speeds (e.g., over 20 GHz) are used.

SUMMARY

The term embodiment and like terms are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter, nor is it intended to be used in isolation to determine the scope of the claimed subject matter. The subject matter should be understood by reference to appropriate portions of the entire specification of this disclosure, any or all drawings and each claim.

Embodiments of the present disclosure include an expansion socket for a computing device. The expansion socket comprises a housing couplable to a circuit board of a computing device. The housing comprises an opening for receiving an expansion card. The expansion socket also comprises a plurality of connection pins disposed within the housing and electrically coupled to the circuit board. Each of the plurality of connection pins comprises a distal end extending away from the circuit board; a contact region spaced apart from the distal end; a conductive plating; and a distal region of the connection pin. The contact region makes electrical contact with the expansion card when the expansion card is inserted into the housing. The conductive plating covers a proximal region of the connection pin. The distal region of the connection pin is devoid of the conductive plating. The distal region of the connection pin is located between the contact region and the distal end.

In some cases, the distal region comprises at least 50% of the distance from the distal end to the contact region. In some cases, the distal region is covered by a material having a dielectric loss tangent greater than 0.1. In some cases, the distal region is painted with an electrically resistive material. In some cases, the plurality of connection pins is electrically coupled to high frequency components of the circuit board. In some cases, the high frequency components are configured to send or receive electrical signals through the plurality of connection pins at frequencies of 20 GHz or greater. In some cases, the expansion socket is a PCIe socket.

Embodiments of the present disclosure include a connection pin for use in an expansion socket of a circuit board. The connection pin comprises a proximal end electrically couplable to a circuit board; a distal end extending away from the proximal end; a contact region spaced apart from the distal end; a conductive plating; and a distal region. The contact region is configured to make electrical contact with an expansion card when the expansion card is inserted into an expansion socket having the connection pin installed therein. The conductive plating covers a proximal region of the connection pin. The distal region of the connection pin is devoid of the conductive plating. The distal region of the connection pin is located between the contact region and the distal end.

In some cases, the distal region comprises at least 50% of the distance from the distal end to the contact region. In some cases, the distal region is covered by a material having a dielectric loss tangent greater than 0.1. In some cases, the distal region is painted with an electrically resistive material. In some cases, the connection pin is a connection pin of a PCIe socket. In some cases, a method can comprise providing the connection pin and passing electrical signals through the connection pin at a frequency of 20 GHz or greater.

Embodiments of the present disclosure include a method for preparing a connector pin. The method comprises providing a metal connector pin having a proximal end and a distal end. The method further comprises preparing a divided conductive plating on the metal connector pin. The divided conductive plating comprises a conductive plating covering a proximal region of the metal connector pin and a distal region devoid of the conductive plating. The method further comprises incorporating the metal connector pin into an expansion socket.

In some cases, preparing the divided conductive plating on the metal connector pin comprises: applying a temporary covering the distal region; applying the conductive plating to the metal connector pin while the distal region is temporarily covered; and removing the temporary covering from the distal region. In some cases, preparing the divided conductive plating on the metal connector pin comprises: applying a material to the distal region, wherein the material has a dielectric loss tangent greater than 0.1; and plating the conductive plating on the connector pin after applying the material to the distal region. In some cases, preparing the divided conductive plating on the metal connector pin comprises: plating the conductive plating on the connector pin; and removing the conductive plating from the connector pin within the distal region. In some cases, the method further comprises electrically coupling the connection pin to a high-frequency component of a circuit board. In some cases, the method further comprises passing electrical signals through the connection pin at a frequency of 20 GHz or greater. In some cases, incorporating the metal connector pin into the expansion socket comprises incorporating the metal connector pin into a PCIe expansion socket.

BRIEF DESCRIPTION OF THE DRAWINGS

The specification makes reference to the following appended figures, in which use of like reference numerals in different figures is intended to illustrate like or analogous components.

DETAILED DESCRIPTION

Figure 1:
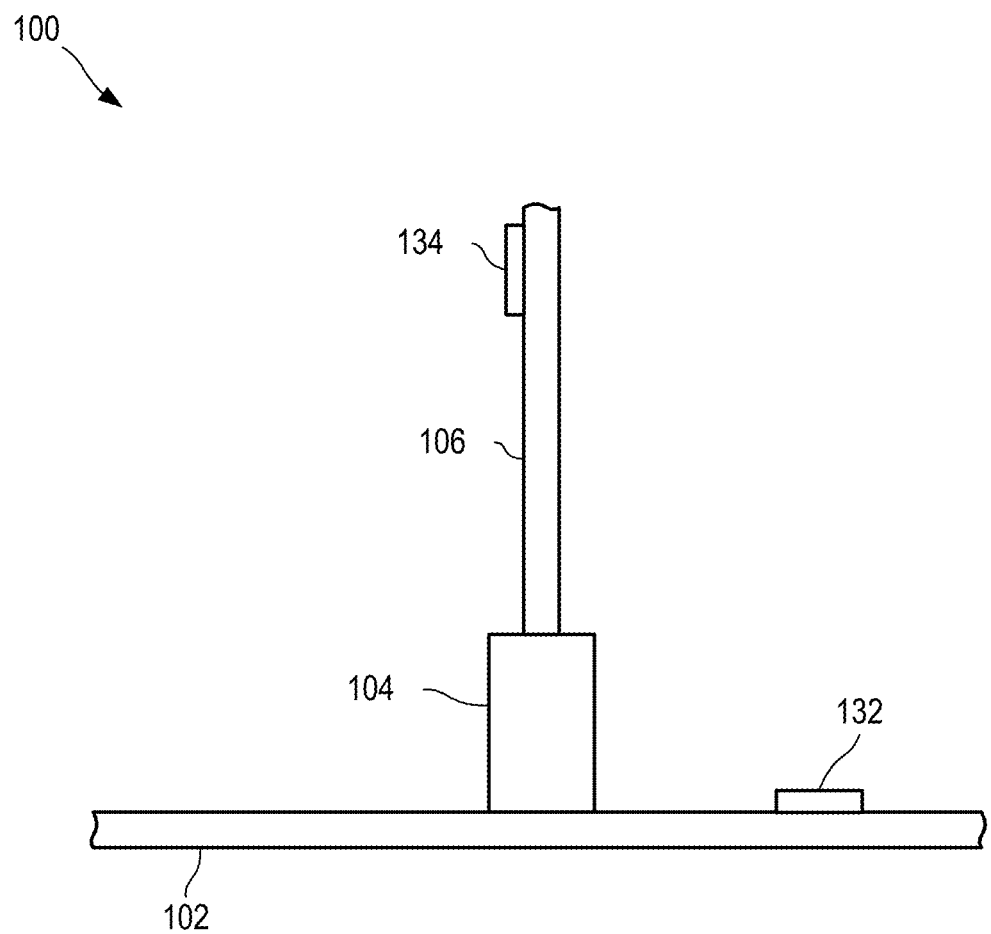
FIG. 1 is a schematic side view of a computing system having an expansion card socket, according to certain aspects of the present disclosure.

Certain aspects and features of the present disclosure relate to a connection pin for an expansion socket that is treated to improve signal (e.g., reduce noise) for high speed applications. Multiple connection pins can be soldered to a circuit board, extend distally away from the circuit board, and be housed within a housing of an expansion card socket. When an expansion card is inserted into the socket, pads on the card can make electrical contact with the connection pins at a contact region of the connection pin. Connection pins as disclosed herein can be treated to have a conductive plating covering a proximal region of the connection pin extending at least between the contact region and the circuit board. A distal region located distally of the contact region, however, can be devoid of the conductive plating, such as covered with a high-resistance material. Thus, electrical signals passing through the connection pin will tend to pass through the conductive plating rather than along the distal region of the pin. Thus, signal reflections and other artifacts and noise can be avoided.

Expansion sockets can be used on any suitable circuit boards, such as printed circuit boards (PCBs), such as computer motherboards. Often, a motherboard will have multiple expansion sockets to accept expansion cards. A common type of expansion socket is one used for a PCIe interface, also known as a PCIe socket. Such a socket can include a plurality of opposing connection pins within, designed to accept a PCIe expansion card. The PCIe expansion card includes a number of contact pads disposed at or near an edge of the card, on both a front and rear side of the card. Thus, when the expansion card is inserted into a corresponding socket, the opposing connection pins are pressed against the contact pads of the expansion card at a contact region of the connection pins. Certain aspects of the present disclosure may be especially suitable for use with high-speed interfaces, such as PCIe interfaces. Nevertheless, certain aspects of the present disclosure can be useful for other types of interfaces.

In some cases, the connection pins are longer than the distance from the circuit board to the contact region. In some cases, that portion of a connection pin located distally of the contact region can be used to help mechanically and/or structurally secure the connection pin within the housing of the socket. For example, in some cases, the housing of a socket can include small recesses or openings through which the distal ends of the connection pins can pass, such as to improve mechanical stability. For example, lateral flexion or impact on a connection pin may tend to urge the connection pin in a lateral direction along the length of the expansion socket, which might otherwise cause damage or misalignment if not for the distal end of the connection pin being located within a recess or opening of the housing to help counteract such lateral flexion or impact. Additionally, it can be difficult to manufacture a socket having a distal end that does not extend further than the contact region. Thus, it can be desirable to manufacture connection pins that have a distal end that is spaced apart from the contact region. This portion of the connection pin that extends from the contact region to the distal end can be known as a stub.

In normal operation, electrical signals are carried through the connection pin between a proximal end coupled to the circuit board and the contact region electrically coupled to the expansion card. Nevertheless, electrical signals can continue to propagate along the stub of the connection pin, which can result in interference, noise, and other undesirable signal issues that may reduce the effective signal amplitude.

Generally, connection pins are manufactured from a metal. The connection pins can be manufactured from an inexpensive and mechanically robust metal, such as copper, although other metals can be used. To achieve a robust electrical connection and strong signal strength between the expansion card and the circuit board, the connection pin is plated with a highly conductive metal, such as gold or silver. In some cases, this conductive plating can be made of other materials (e.g., metals) that have a higher conductivity than the metal core. Thus, each connection pin comprises a metal core and a conductive plating. In use, the electrical signals primarily pass along the conductive plating surrounding the metal core, rather than through the metal core.

Certain aspects of the present disclosure relate to manufacturing and/or treating the connection pin in a fashion that reduces the amount of electrical signal passing through the stub by creating a distal region devoid of the conductive plating. Thus, the connection pin can be comprised of a metal core, conductive plating extending up to a dividing line, and a distal region devoid of conductive plating extending from the dividing line towards the distal end of the connection pin. In some cases, the distal region devoid of conductive plating extends all the way to the distal end of the connection pin, but that may not always be the case. For example, the distal region can be a distal band devoid of conductive plating, while the distal end of the connection pin is still plated with the conductive plating.

In some cases, the distal region can be coated, plated, or otherwise covered with a material having a high dielectric loss. In some cases, the distal region can be coated, plated, or otherwise covered with a material having a dielectric loss tangent at or greater than 0.07, 0.08, 0.09, 0.1, 0.11, 0.12, or 0.13, such as greater than 0.1. For example, a silicone resin composite can be used to coat (e.g., through painting), plate, or otherwise cover a portion of the stub of the connection pin. In some cases, the distal region can be coated, plated, or otherwise covered with a resistive material, such as a highly resistive material or any other material that has a higher resistance than the conductive plating and/or the metal core.

In some cases, the distal region can be coated, plated, or otherwise covered prior to plating of the remainder of the connection pin, thus resulting in a connection pin with conductive plating in a proximal region, but no conductive plating in the distal region. In some cases, such coating, plating, or covering of the distal region can be temporary (e.g., removable after plating of the remainder of the connection pin) or permanent.

In some cases, the distal region can be established by treating or otherwise modifying an already plated connection pin to remove the conductive plating from the distal region. Such treatment can involve mechanically removing the conductive plating (e.g., through grinding, sanding, or polishing), chemically removing the conductive plating, or otherwise.

Certain aspects of the present disclosure thus establish a connection pin having a stub with high signal loss characteristics. Thus, the amplitude of reflection signals caused by the stub is lower than that of a standard connection pin. Thus, an expansion socket comprising connection pins as disclosed herein can provide a stronger and more robust signal, especially in high frequency ranges (e.g., at or above 20 GHz).

These illustrative examples are given to introduce the reader to the general subject matter discussed here and are not intended to limit the scope of the disclosed concepts. The following sections describe various additional features and examples with reference to the drawings in which like numerals indicate like elements. Directional descriptions are used to describe the illustrative embodiments but, like the illustrative embodiments, should not be used to limit the present disclosure. The elements included in the illustrations herein may not be drawn to scale. Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

FIG. 1 is a schematic side view of a computing system 100 having an expansion card socket 104, according to certain aspects of the present disclosure. The computing system 100 can be any suitable computing system, such as a home computer, a server, or any other suitable computing system. The computing system 100 can include one or more expansion card sockets 104. In some cases, one or more such expansion card sockets 104 can be used as part of an interface, such as a PCIe interface, although other interfaces can be used.

The expansion card socket 104 can be coupled to a circuit board 102. Circuit board 102 can be any suitable circuit board, such as a printed circuit board (PCB), a computer motherboard, or any other suitable circuit board. The expansion card socket 104 can include a housing and internal connection pins, such as connection pins disclosed in further detail herein. The housing can be mechanically secured to the circuit board 102 through any suitable technique. The internal connection pins can be electrically coupled to the circuit board 102 through any suitable technique, such as soldering.

The expansion card socket 104 can be sized to receive a corresponding expansion card 106. As depicted in FIG. 1, the expansion card 106 can be inserted into the expansion card socket 104 in a downward direction from the top of the figure towards the bottom of the figure (e.g., a direction perpendicular the circuit board 102. However, in some cases, the expansion card socket 104 can be configured to receive an expansion card 106 in other directions, such as in a direction parallel the circuit board 102.

Through the connection established by inserting the expansion card 106 into the expansion card socket 104, an electrical connection can be established to send electrical signals between a component 134 on the expansion card 106 and a component 132 on the circuit board 102. For example, high speed (e.g., high frequency) electrical signals can pass, via the connection pins of the expansion card socket 104, between component 132 (e.g., a central processing unit) and component 134 (e.g., a graphics processing unit).

Figure 2:
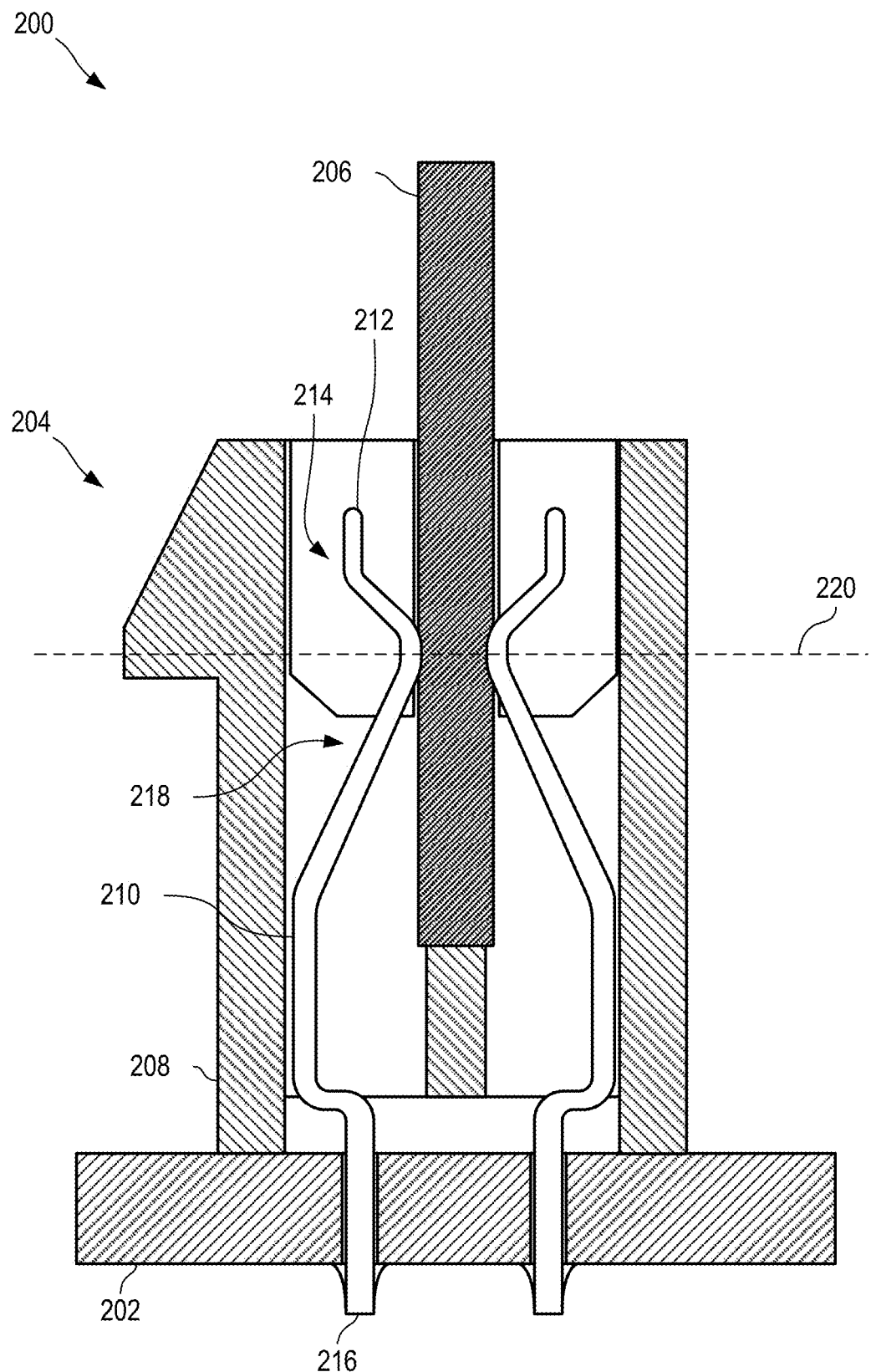
FIG. 2 is a cross-sectional view of a system having an expansion card socket, according to certain aspects of the present disclosure.

FIG. 2 is a cross-sectional view of a system 200 having an expansion card socket 204, according to certain aspects of the present disclosure. The system 200 can comprise an expansion card socket 204 coupled to a circuit board 202. The system 200 can be computing system 100 of FIG. 1.

The expansion card socket 204 can include a housing 208 containing multiple connection pins 210. The multiple connection pins 210 can be arranged in opposing rows, although other arrangements can be used. Each connection pin 210 can include a proximal end 216 and a distal end 212. The proximal end 216 can be electrically coupled to the circuit board 202, such as via soldering. The distal end 212 can extend away from the circuit board 202. Between the proximal end 216 and distal end 212, the connection pin 210 can be shaped (e.g., bent) to establish a contact region for making electrical contact with contact pads of an expansion card 206 when the expansion card 206 is inserted into the expansion card socket 204. The expansion card 206 can have multiple contact pads on each of the front and back sides of the expansion card 206 (e.g., the left and right sides, as seen in FIG. 2). As depicted in FIG. 2, the contact region of the connection pins 210 can be at and/or around contact line 220. The contact line 220 can be a centerline of the contact region. The contact region can extend beyond the contact line 220 by a number of mm (e.g., at or approximately 0.05 mm, 0.1 mm, 0.15 mm, 0.2 mm, 0.25 mm, 0.3 mm, 0.35 mm, 0.4 mm, 0.45 mm, 0.5 mm, 0.55 mm, 0.6 mm, 0.65 mm, 0.7 mm, 0.75 mm, 0.8 mm, 0.85 mm, 0.9 mm, 0.95 mm, 1 mm, 1.05 mm, 1.1 mm, 1.15 mm, 1.2 mm, 1.25 mm, 1.3 mm, 1.35 mm, 1.4 mm, 1.45 mm, 1.5 mm, 1.55 mm, 1.6 mm, 1.65 mm, 1.7 mm, 1.75 mm, 1.8 mm, 1.85 mm, 1.9 mm, 1.95 mm, and/or 2 mm).

The connection pin 210 can include a proximal region 218 and a distal region 214. The proximal region 218 can extend from the circuit board 202 and/or the proximal end 216 up through the contact region. The proximal region 218 of the connection pin 210 is plated in a conductive plating, which can be any suitable plating material, such as gold or silver. The distal region 214 can be devoid of conductive plating, which can include having no, substantially no, or very little conductive plating thereon. The distal region 214 can be covered (e.g., coated, painted, or plated) with a high dielectric loss material, as described in further detail herein.

Figure 3:
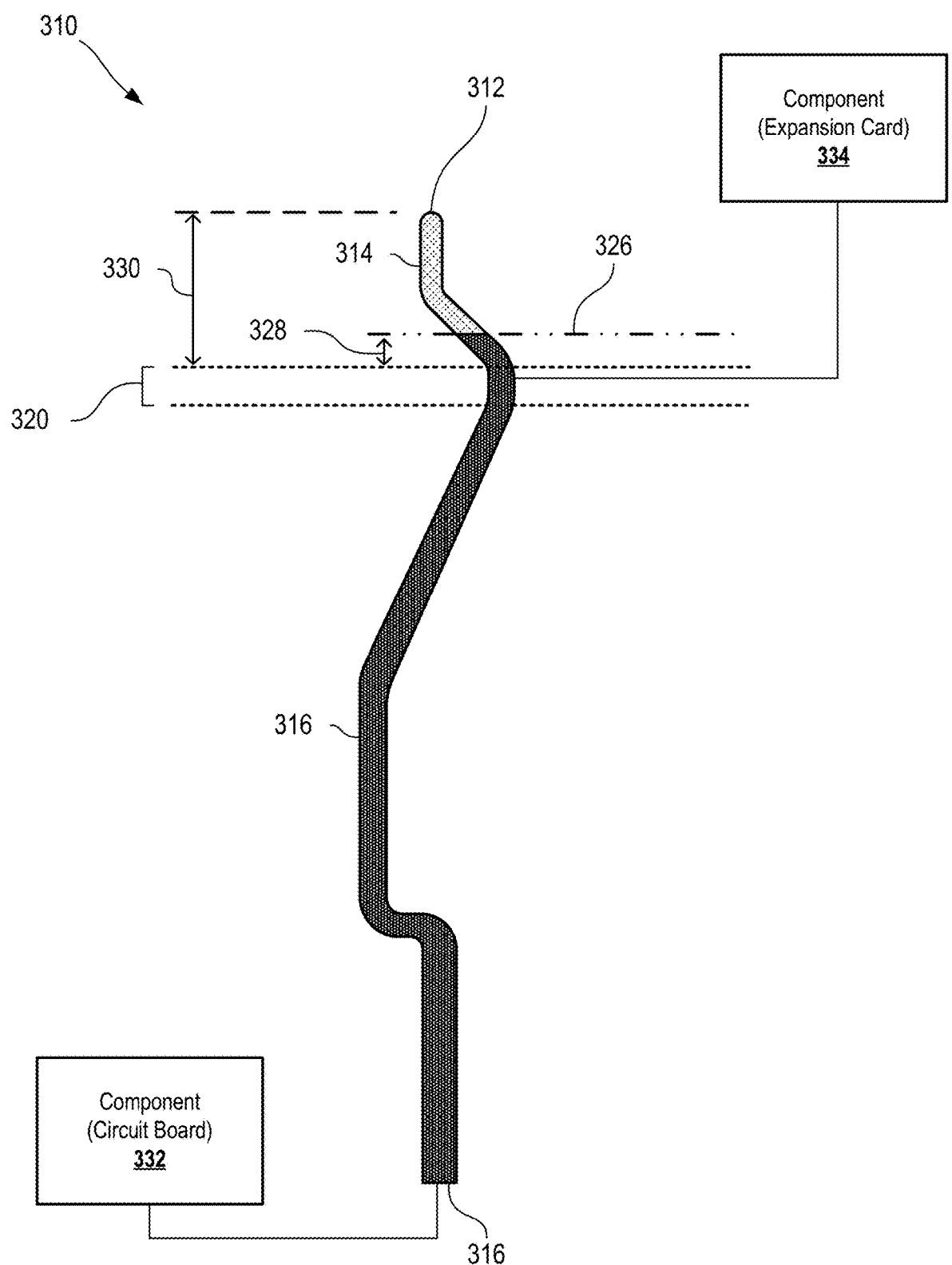
FIG. 3 is a schematic side view of a connection pin of an expansion card socket, according to certain aspects of the present disclosure.

FIG. 3 is a schematic side view of a connection pin 310 of an expansion card socket, according to certain aspects of the present disclosure. The connection pin 310 can be connection pin 210 of FIG. 2. The connection pin 310 can include a proximal end 316 and a distal end 312. The proximal end 316 can be electrically coupled to a component 332 of a circuit board, such as a high-frequency component, via circuit traces in the circuit board. The connection pin 310 can include a contact region 320 located between the proximal end 316 and the distal end 312. The contact region 320 is a region in which the connection pin 310 makes electrical contact with an expansion card when the expansion card is inserted (e.g., fully inserted) into an expansion card socket (e.g., socket 204 of FIG. 2) in which the connection pin 310 is installed. The contact region 320 can be linear or can have a thickness, such as described above with reference to FIG. 2.

A proximal region 316 of the connection pin 310 can be plated in a conductive plating, such as gold or silver. The proximal region 316 extends from the circuit board and/or the proximal end 316 up to a dividing location 326 (e.g., a dividing line). The dividing location 326 can be located within, at, or distally of the contact region 320, although it will generally be located distally of the contact region 320.

During operation, electrical signals can be exchanged between component 332 of the circuit board and component 334 of the expansion card via the connection pin 310. Specifically, the electrical signals can pass through the conductive plating of the proximal region 316. At the proximal end 316, the conductive plating of the proximal region 316 can be soldered to a contact pad or electrical trace of the circuit board. At the contact region 320, the conductive plating can make electrical contact with a contact pad or electrical trace of the expansion card.

The connection pin 310 includes a distal region 314. As depicted in FIG. 3, the distal region 314 extends from the dividing location 326 to the distal end 312 of the connection pin 310, however that need not always be the case. In some locations, the distal region 314 has a thickness that is less than the distance from the dividing location 326 to the distal end 312. The distal region 314 can be devoid of conductive plating, as disclosed herein. In some cases, the distal region 314 can be covered with a high dielectric loss material, such as described in further detail herein.

In some cases, the dividing location 326 is spaced apart from the contact region 320 (e.g., from the distal-most point of the contact region 320) by a distance 328. The distance 328 can be any suitable distance. In some cases, the distance 328 is at or less than 80%, 75%, 70%, 65%, 60%, 55%, 50%, 45%, 40%, 35%, 30%, 25%, 20%, 15%, 10%, and/or 5% of the distance 330. Distance 330 is the distance between the contact region 320 and the distal end 312 of the connection pin 310.

In some cases, the distal region 314 comprises at or approximately 20%, 25%, 30%, 35%, 40%, 45%, 50%, 55%, 60%, 65%, 70%, 75%, 80%, 85%, 90%, and/or 95% or more of the distance 330 from the distal end 312 to the contact region 320. In an example, a connection pin 310 having a 2.7 mm stub (e.g., a distance 330 of at or approximately 2.7 mm) can have a distal region 314 of at or approximately 0.9 mm, although other values can be used.

Figure 4:
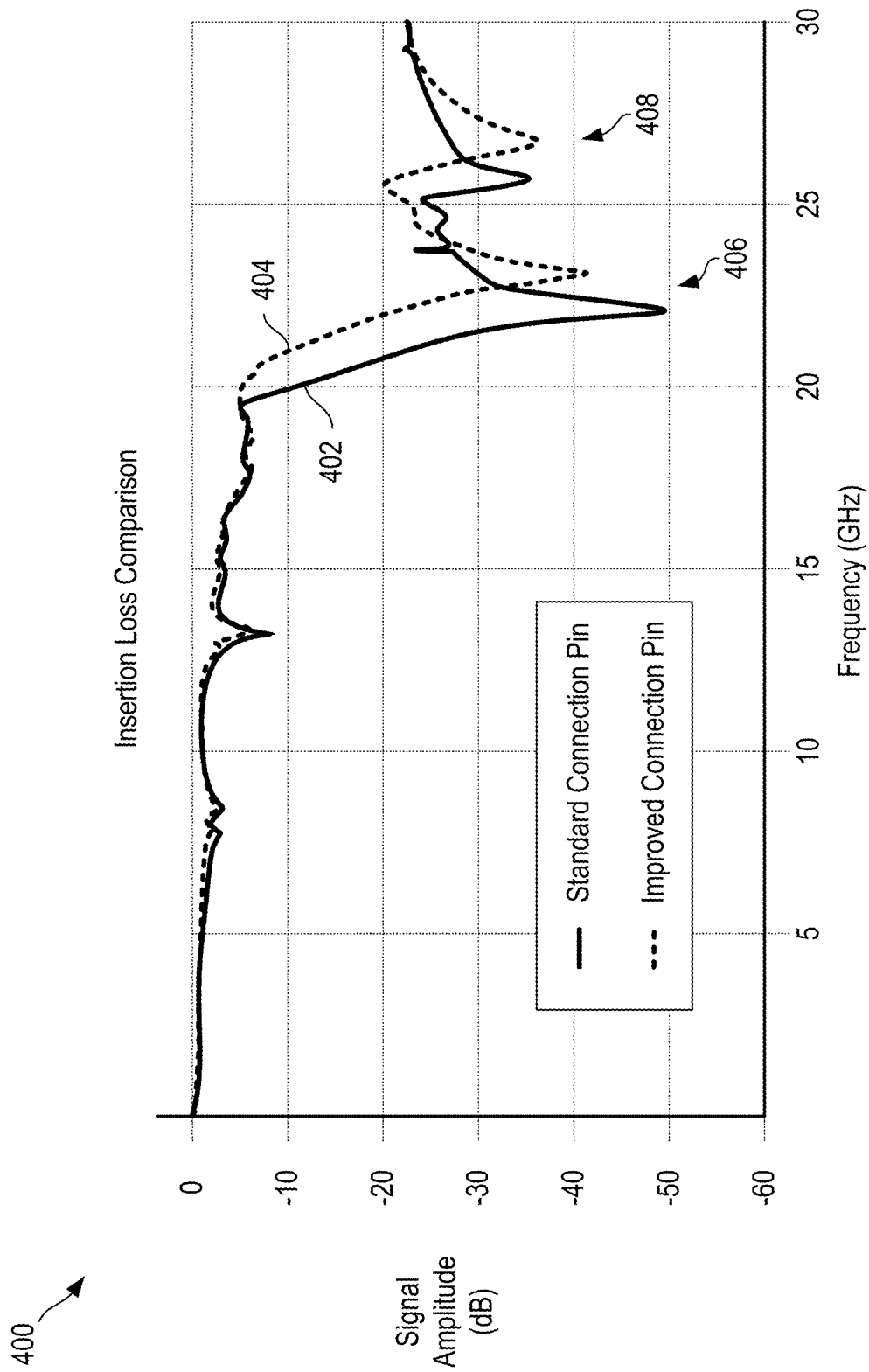
FIG. 4 is a chart comparing insertion loss between a standard connection pin and a connection pin according to certain aspects of the present disclosure.

FIG. 4 is a chart 400 comparing insertion loss between a standard connection pin and a connection pin according to certain aspects of the present disclosure. Line 402 depicts signal amplitude over frequency for a standard connection pin, such as common PCIe connection pin. Line 404 depicts signal amplitude over frequency for an improved connection pin (e.g., a connection pin according to certain aspects of the present disclosure), such as connection pin 310 of FIG. 3.

Chart 400 shows two regions 406, 408 of reduced signal amplitude that result from various reflections and interactions of signals due to stubs on either the connection pin or the expansion card. Region 406 at approximately 22-23 GHz is associated with signal losses that occur due to the presence of the stub of the connection pin, as described in further detail herein. Region 408 at approximately 26-27 GHz is associated with signal losses that occur due to the presence of the stub of the expansion card. The stub of the expansion card can include a region of the contact pad of the expansion card that is located deeper within the expansion card socket than the contact region of the connection pin.

As seen in chart 400, the use of a connection pin with a distal region devoid of conducting plating can significantly improve signal, especially within region 406. There is approximately a 10 dB difference in signal drop between the standard connection pin and the improved connection pin. This 10 dB difference in signal strength is substantial.

Additionally, it can be seen that the use of the improved connection pin can provide a strong signal at other high frequencies. Thus, certain aspects of the present disclosure can be especially useful for signals that operate at high frequencies, such as frequencies at or above approximately 10 GHz, 12.5 GHz, 15 GHz, 17.5 GHz, 18 GHz, 18.5 GHz, 19 GHz, 19.5 GHz, 20 GHz, 20.5 GHz, 21 GHz, 21.5 GHz, 22 GHz, 22.5 GHz, 23 GHz, 23.5 GHz, 24 GHz, 24.5 GHz, 25 GHz, 25.5 GHz, 26 GHz, 26.5 GHz, 27 GHz, 27.5 GHz, and/or 30 GHz. In some cases, certain aspects of the present disclosure can be especially useful for signals that operate at frequencies at or above 20 GHz. In some cases, certain aspects of the present disclosure can be especially useful for signals that operate at frequencies susceptible to interference or signal loss due to the presence of a stub on the connection pin, such as frequencies in the ranges of 20-30 GHz, 20-25 GHz, and/or 21-24 GHz.

Figure 5:
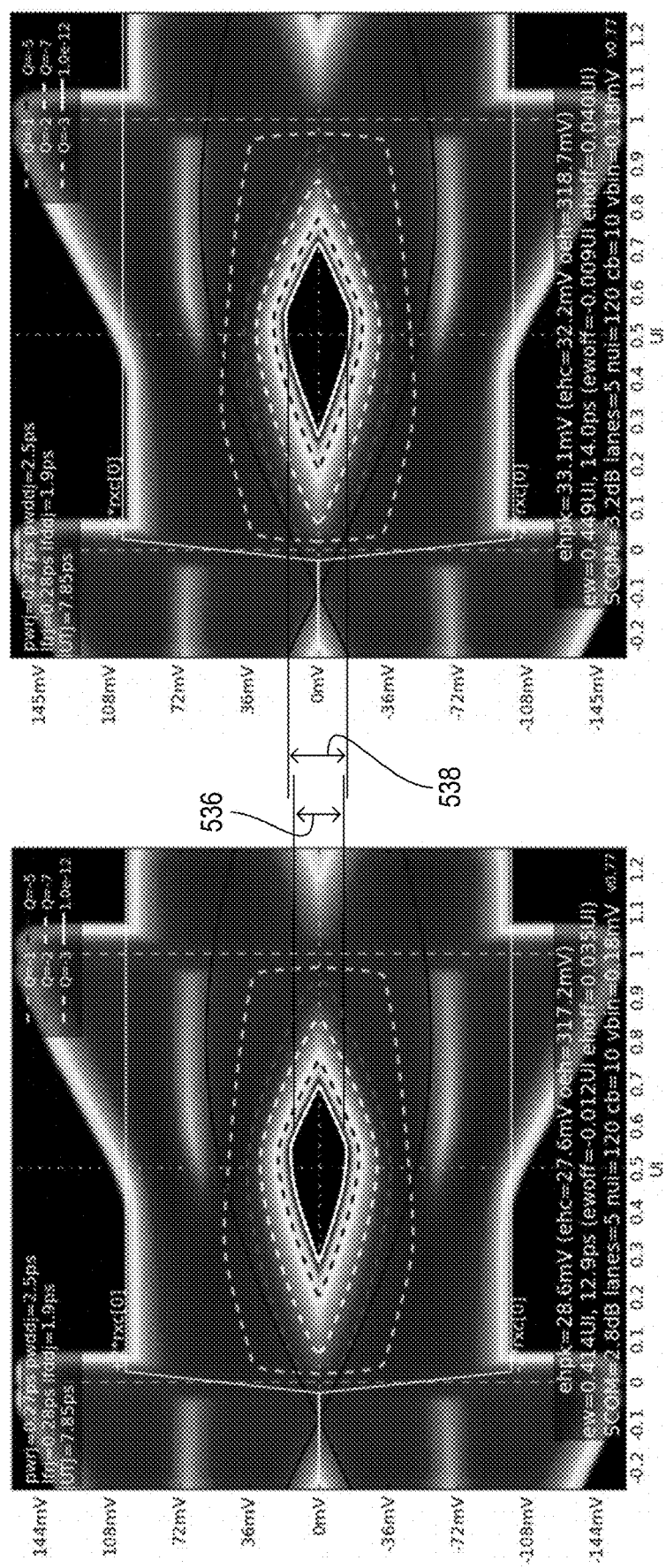
FIG. 5 is a set of eye-diagrams depicting signal quality of a standard connection pin and of a connection pin according to certain aspects of the present disclosure.

FIG. 5 is a set of eye-diagrams depicting signal quality of a standard connection pin and of a connection pin according to certain aspects of the present disclosure. Eye-diagram 500 depicts signal quality of a standard connection pin, such as a standard PCIe connection pin. Eye-diagram 501 depicts signal quality of an improved connection pin (e.g., a connection pin according to certain aspects of the present disclosure), such as connection pin 310 of FIG. 3.

An eye-diagram depicts signal quality information associated with high-speed digital signals. The height of the inner contour of the inner eye is indicative of the signal-to-noise ratio of the signal. The taller the inner eye, the better the signal-to-noise ratio.

As depicted in FIG. 5, the eye-diagram 500 of the standard connection pin has an inner eye height 536 that is substantially shorter than the inner eye height 538 of the eye-diagram 501 of the improved connection pin. Thus, the improved connector pin is shown to provide a substantially improved signal-to-noise ratio.

Figure 6:
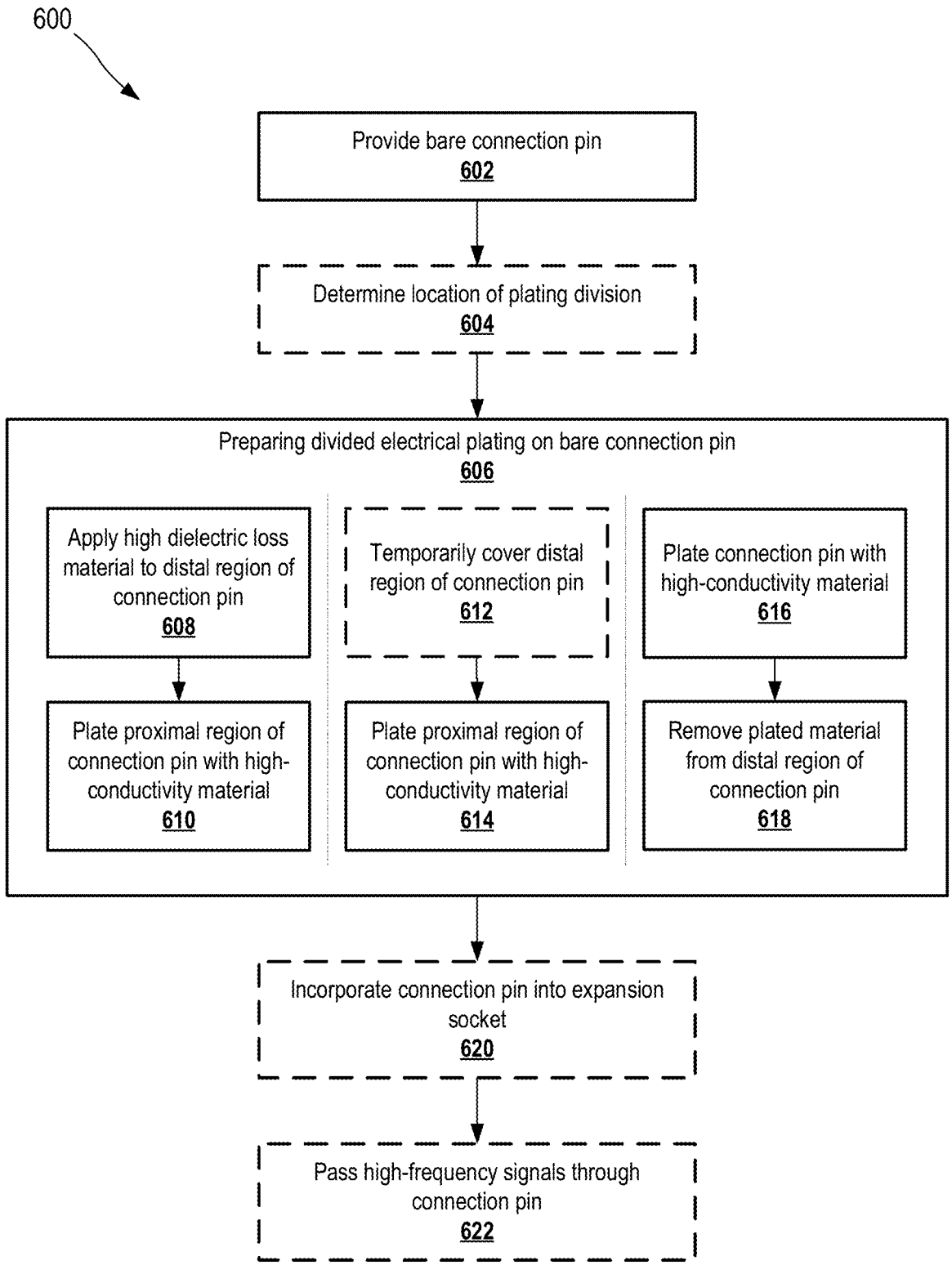
FIG. 6 is a flowchart depicting a process for preparing a connection pin, according to certain aspects of the present disclosure.

FIG. 6 is a flowchart depicting a process 600 for preparing a connection pin according to certain aspects of the present disclosure. Process 600 can be performed to make and/or use a connection pin as disclosed herein, such as connection pin 310 of FIG. 3.

At block 602, a bare connection pin can be provided. The bare connection pin can be formed of a suitable material, such as copper. The bare connection pin can be shaped in a suitable form factor, such as the form factor of a PCIe connection pin, although that need not always be the case. In some cases, shaping can occur sometime prior to block 620.

At optional block 604, a location of the plating division (e.g., dividing location, such as dividing location 26) can be determined. Determining the location of the plating division can be based on a determination of the contact region. In some cases, determining the location of the plating division can be based on the desired frequencies expected to be used for signals passing through the connection pin. For example, a desired length of distance to continue the conductive plating distally of the contact region can be calculated to include minimal or reduced interference based on a particular desired frequency or set of frequencies.

At block 606, a divided conductive plating can be prepared on the bare connection pin. Preparing the dividing conductive plating on the bare connection pin can involve creating a proximal region that is plated with a conductive plating, such as gold or silver, and a distal region that is devoid of the conductive plating. Preparing the divided conductive plating at block 606 can involve any suitable technique, although FIG. 6 depicts three particular techniques, starting at blocks 608, 612, and 616, respectively.

At block 608, a high dielectric loss material can be applied to the distal region of the connection pin. Applying the high dielectric loss material can be performed using any suitable technique, such as coating (e.g., painting) or plating, although other techniques can be used. After application of the high dielectric loss material at block 608, the proximal region of the connection pin can be plated with a high-conductivity material at block 610. Due to the existence of the high dielectric loss material on the distal region of the connection pin prior to the plating at block 610, the plating at block 610 will not result in plating the high-conductivity material (e.g., gold or silver) onto the distal region.

Alternatively, at block 612, the distal region of the connection pin can be temporarily covered with a removable material capable of inhibiting plating. After block 612, the proximal region of the connection pin can be plated with a high-conductivity material at block 614. Due to the existence of the temporary covering over the distal region of the connection pin prior to the plating at block 614, the plating at block 614 will not result in plating the high-conductivity material (e.g., gold or silver) onto the distal region. After block 614, the temporary covering can be optionally removed.

Alternatively, at block 616, the connection pin can be plated with a high-conductivity material. Plating at block 616 can include plating some or all of the distal region of the connection pin, including optionally all of the connection pin. After plating at block 616, plated material can be removed from the distal region of the connection pin at block 618. Removal of the plated material can be achieved through any suitable technique, including mechanical (e.g., grinding, sanding, or polishing) or chemical techniques. In some cases, a high dielectric loss material can be applied to the distal region after the plated material has been removed.

After the divided electrical plating has been prepared at block 606, the connection pin can be incorporated into an expansion socket at optional block 620. For example, the connection pin can be incorporated into a PCIe expansion socket. In some cases, incorporating the connection pin into an expansion socket can include electrically coupling the connection pin to a circuit board.

At optional block 622, high-frequency signals can be passed through the connection pin. For example, signals having frequencies at or above 20 GHz can be passed through the connection pin. In some cases, passing high-frequency signals through the connection pin can involve passing PCIe signals through the connection pin.

In some cases, instead of a high dielectric loss material as described with reference to blocks 608, 616, an electrically resistive material (e.g., high resistance material) can be used.

The foregoing description of the embodiments, including illustrated embodiments, has been presented only for the purpose of illustration and description and is not intended to be exhaustive or limiting to the precise forms disclosed. Numerous modifications, adaptations, and uses thereof will be apparent to those skilled in the art. Additionally, while a particular feature of the disclosure may have been disclosed with respect to only one of several implementations, such feature may be combined with one or more other features of the other implementations as may be desired and advantageous for any given or particular application. Thus, the breadth and scope of the present invention should not be limited by any of the above described embodiments.

One or more elements or aspects or steps, or any portion(s) thereof, from one or more of any of claims 1-20 below can be combined with one or more elements or aspects or steps, or any portion(s) thereof, from one or more of any of the other claims 1-20 or combinations thereof, to form one or more additional implementations and/or claims of the present disclosure.

What is claimed is:

1. An expansion socket for a computing device, comprising:
   a housing couplable to a circuit board of a computing device, the housing comprising an opening for receiving an expansion card;
   a plurality of connection pins disposed within the housing and electrically coupled to the circuit board, wherein each of the plurality of connection pins comprises:
   a distal end extending away from the circuit board;
   a contact region spaced apart from the distal end, wherein the contact region makes electrical contact with the expansion card when the expansion card is inserted into the housing;
   a conductive plating covering a proximal region of the connection pin, wherein the conductive plating extends from the contact region to the circuit board to electrically couple the expansion card to the circuit board when the expansion card is inserted into the housing; and
   a distal region of the connection pin devoid of the conductive plating, wherein the distal region of the connection pin is located between the contact region and the distal end.

2. The expansion socket of claim 1, wherein the distal region comprises at least 50% of the distance from the distal end to the contact region.

3. The expansion socket of claim 1, wherein the expansion socket is a PCIe socket.

4. The expansion socket of claim 1, wherein the distal region is covered by a material having a dielectric loss tangent greater than 0.1.

5. The expansion socket of claim 4, wherein the distal region is painted with an electrically resistive material.

6. The expansion socket of claim 1, wherein the plurality of connection pins is electrically coupled to high frequency components of the circuit board.

7. The expansion socket of claim 6, wherein the high frequency components are configured to send or receive electrical signals through the plurality of connection pins at frequencies of 20 GHz or greater.

8. A connection pin for use in an expansion socket of a circuit board, the connection pin comprising:
   a proximal end electrically couplable to a circuit board;
   a distal end extending away from the proximal end;
   a contact region spaced apart from the distal end, wherein the contact region is configured to make electrical contact with an expansion card when the expansion card is inserted into the expansion socket having the connection pin installed therein;
   a conductive plating covering a proximal region of the connection pin, wherein the conductive plating extends from the contact region to the circuit board to electrically couple the expansion card to the circuit board when the expansion card is inserted into the housing; and
   a distal region of the connection pin devoid of the conductive plating, wherein the distal region of the connection pin is located between the contact region and the distal end.

9. The connection pin of claim 8, wherein the distal region comprises at least 50% of the distance from the distal end to the contact region.

10. The connection pin of claim 8, wherein the connection pin is a connection pin of a PCIe socket.

11. The connection pin of claim 8, wherein the distal region is covered by a material having a dielectric loss tangent greater than 0.1.

12. The connection pin of claim 11, wherein the distal region is painted with an electrically resistive material.

13. A method, comprising:
providing a metal connector pin having a proximal end and a distal end, and a contact region, the contact region located between the proximal end and the distal end, the proximal end configured to be attached to a circuit board;
preparing a divided conductive plating on the metal connector pin, wherein the divided conductive plating comprises a conductive plating covering a proximal region of the metal connector pin and a distal region devoid of the conductive plating, and wherein the conductive plating extends from the contact region of the metal connector pin to the proximal end to electrically couple an expansion card to the circuit board when the expansion card is inserted into a housing of an expansion socket; and
incorporating the metal connector pin into the expansion socket.

14. The method of claim 13, wherein preparing the divided conductive plating on the metal connector pin comprises:
applying a temporary covering the distal region;
applying the conductive plating to the metal connector pin while the distal region is temporarily covered; and
removing the temporary covering from the distal region.

15. The method of claim 13, wherein preparing the divided conductive plating on the metal connector pin comprises:
applying a material to the distal region, wherein the material has a dielectric loss tangent greater than 0.1; and
plating the conductive plating on the connector pin after applying the material to the distal region.

16. The method of claim 13, wherein preparing the divided conductive plating on the metal connector pin comprises:
plating the conductive plating on the connector pin; and
removing the conductive plating from the connector pin within the distal region.

17. The method of claim 13, further comprising electrically coupling the connection pin to a high-frequency component of a circuit board.

18. The method of claim 13, further comprising passing electrical signals through the connection pin at a frequency of 20 GHz or greater.

19. The method of claim 13, wherein incorporating the metal connector pin into the expansion socket comprises incorporating the metal connector pin into a PCIe expansion socket.

* * * * *